(12) United States Patent
Bergstedt

(10) Patent No.: US 6,421,225 B2
(45) Date of Patent: *Jul. 16, 2002

(54) ELECTRIC COMPONENT

(75) Inventor: Leif Bergstedt, Sjömarken (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/333,880

(22) Filed: Jun. 15, 1999

(30) Foreign Application Priority Data

Jun. 15, 1998 (SE) ............................. 9802157

(51) Int. Cl.⁷ ........................... H01G 4/20; H01G 4/30; H01G 4/228
(52) U.S. Cl. ................ 361/313; 361/301.4; 361/306.1; 361/311; 361/763
(58) Field of Search ................ 361/320, 321.1, 361/378, 321.2–321.5, 301.1, 301.2, 301.4, 303, 306.1–306.3, 311, 312, 313, 323, 761–764

(56) References Cited

U.S. PATENT DOCUMENTS

| | | | | | |
|---|---|---|---|---|---|
| 3,136,680 A | * | 6/1964 | Hochberg | ................... | 442/117 |
| 3,778,689 A | * | 12/1973 | Bodway | ................... | 317/258 |
| 3,806,775 A | * | 4/1974 | Edman | ................... | 317/258 |
| 3,886,415 A | * | 5/1975 | Genthe | ................... | 361/314 |
| 4,283,453 A | | 8/1981 | Siefried et al. | | |
| 4,640,866 A | * | 2/1987 | Suzuki | ................... | 428/422 |
| 5,065,253 A | | 11/1991 | Ishii | | |
| 5,065,284 A | | 11/1991 | Hernandez | | |
| 5,172,304 A | * | 12/1992 | Ozawa et al. | ................... | 361/401 |
| 5,625,528 A | | 4/1997 | Devoe et al. | | |
| 5,625,655 A | | 4/1997 | McDonald et al. | | |
| 5,870,274 A | * | 2/1999 | Lucas | ................... | 361/311 |

FOREIGN PATENT DOCUMENTS

| | | |
|---|---|---|
| EP | 0 545 812 | 6/1993 |
| EP | 0 813 355 A2 | 12/1997 |

* cited by examiner

Primary Examiner—Dean A. Reichard
Assistant Examiner—Eric Thomas
(74) Attorney, Agent, or Firm—Burns, Doane, Swecker & Mathis, L.L.P.

(57) ABSTRACT

Invention refers to an electric component, preferably a component buried in a Printed Circuit Board (PCB) including at least two conductive layers (13,21, 36; 15, 35) and an intermediate layer (14, 37). The intermediate layer (14, 37) further consists of at least two layers (16, 17, 22, 23, 38, 39, 40): at least a first layer (17, 23, 39) and a second layer (16, 22, 38, 40), which at least first layer has more elastic characteristic than the second layer (16, 22, 38, 40) at a certain temperature and/or pressure.

17 Claims, 1 Drawing Sheet

ELECTRIC COMPONENT

TECHNICAL FIELD OF THE INVENTION

The present invention refers to an electric component, and specially to an electric component inside a multilayer printed circuit board and a method for manufacturing the same.

The invention also refers to a multilayer printed circuit board (PCB) including the electric component.

BACKGROUND OF THE INVENTION

Printed circuit boards having several layers, so called "multilayer" PCBs, are frequently used within the electronics. The need for an ever increasing extended number of components on smaller surfaces has resulted in a dramatic increase of the number of the layers as well as the conductors in a multilayer PCB. As is well known, a typical multilayer PCB consists of a number of insulating layers, on or between which conductors are applied. The conductive layers can among others be used as the ground and supply planes. Electric components, such as Integrated Circuits, ICs, are mounted and soldered onto one or both sides of the PCBs, for example in vias and connected to each other or to the ground or supply plane though via holes and the said conductors.

The PCB is normally provided with coupling capacitors, for example to filter interferences that may occur through rapid variations between the ground and supply plane as the result of the operation of ICs. The coupling capacitors are connected between the ground and the supply to the circuits, Usually, the decoupling capacitors are buried in the multilayer PCB between the different layers by providing different capacitive layers between the supporting layers of the board. The board can also be provided with a capacitor layer with different capacitances when assembling circuits or other components.

One problem is to produce capacitive layers with controlled, thin layers.

It is known to use hard capacitor laminates which are placed in the multilayer constructions to create capacitive planes in which the capacitor is arranged. Also, laminates with very well defined composition and thickness are used, for instance an epoxy/ceramic laminate with 95% ceramics.

U.S. Pat. No. 5,065,284 describes production of capacitive islands in a PCB for producing decoupling capacitors. A flexible film including cells with high dielectric is used. Each capacitor consists of one or more high capacitive flexible dielectric plates provided with plated surfaces. Each dielectric plate consists of a single layer of multi-layers or a single-layer, separated from each other shivers or pearls with high dielectric constant provided between the laminae. The space between the pearls is filled with an elastic polymer or a binding agent.

According to U.S. Pat. No. 5,625,528 a monolithic capacitor circuit including several capacitors comprising several layers is produced. The capacitors are isolated from each other through double dielectric constants, three layer laminate and insulation layers. The different layers have different thermal expansion coefficients to give the capacitor circuit a better stability and cracking resistivity.

EP 545 812 discloses a plastic film to be used in capacitors. The film includes a dielectric layer, which comprises two layers, one of which has a melting temperature different from the melting temperature of the other one. The layers are extruded on each other, This document does not concern the elasticity of the materials used. Neither, the PCBs nor buried components are involved.

SUMMARY OF THE INVENTION

The main object with the present invention is to provide thin layers, preferably dielectric layers making multilayer PCB in a controlled way, in particular when producing buried capacitors or the like.

Another object of the invention is to shape the dielectric layer, in a multilayer PCBs, between chosen capacitive planes, preferably only where the dielectric is needed.

Yet another object of the invention is to create a new dielectric for capacitors on multilayer PCBs.

These tasks have been solved by the initially mentioned component including at least two conductive layers and an intermediate layer. The intermediate layer further consists of at least two layers: at least a first layer and a second layer, which at least first layer has more elastic characteristic than the second layer at a certain temperature and/or pressure.

The intermediate layer is a dielectric layer when producing capacitors. Preferably, the dielectric layer consists of two essentially separate layers: a first layer with lower melting temperature than the other layer.

When applying at least one of the conducting layers on the dielectric layer, the layer having lower melting temperature moves away and fills empty spaces and unevenness sections, while the other layer maintains a predefined thickness with desired thinness.

The first layer becomes very thin when it is forced and can adhere the second layer to at least one of the conductive layers, In one embodiment also the second layer has adhesive characteristics.

In one embodiment the intermediate layer consists of three separate layers, whereby one layer between two other layers has higher melting temperature than the two other layers. Preferably, the layers with lower melting temperature are of same material and the layer with higher melting temperature holds a controlled minimum thickness. The layers with lower melting temperature are primarily used to fill out unevenness parts and also to adhere different layers.

In one embodiment all the intermediate layers are produced as a homogenous film.

The intermediate layer contains, in one embodiment, very small amount or no amount of material with high dielectric constants Preferably, the layers in that intermediate layer consist of PTFE (polytetraflourethylene), PFA (perflouroalkoxy) and/or FEP (flourinated ethylene-propylene).

The electric component, in one embodiment, is a buried capacitor in it multilayer PCB. It may also be a resistor.

Moreover, the invention refers to a multi layer PCB, which includes a first and a second laminate and a number of layers constituting a buried electric component. The buried component includes a first and a second conductive layer and one intermediate layer consisting of at least two layers. At least one layer at a certain temperature and/or pressure is more elastic than the other layer.

BRIEF DESCRIPTION OF THE DRAWINGS

The present invention will become more fully apparent from the claims and the description as it proceeds in connection with the drawings, in which:

DESCRIPTION OF THE EMBODIMENTS

Figure 1:
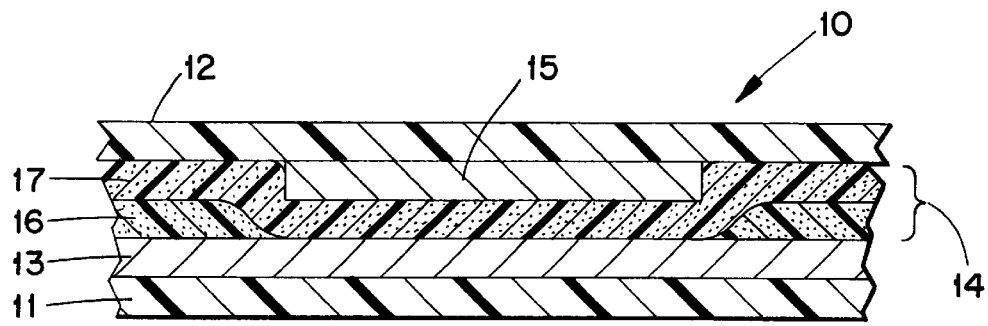
FIG. 1 shows in a schematic way a cross-section through one part of a first PCB with a buried capacitor, according to the invention.

FIG. 1 shows an embodiment of a multilayer PCB 10 provided with a buried capacitor layer. The PCS consists of a first substrate 11 and a second substrate 12. Between the substrate layers 11 and 12 a first conductive layer 13, a dielectric layer 14 and a conductive surface 15 are arranged. The conductive layers are intended to be used as capacitor plates, whereby the first layer 13 is used as the ground plane while that second one 15 as the signal terminal.

The dielectric layer 14 consists of two essentially separate layers 16 and 17. A first layer 16 has a lower melting temperature than that other one 17, which results in that the first layer is more elastic or floating at a certain temperature while the other one maintains its form.

According to the drawing, the conductive layer 15 under the manufacturing process is pressed towards the dielectric layer 14 after heating, so that the first layer 16 with lower melting temperature deforms by floating away while the second layer 17 only deforms a little so that it essentially assumes the external form of the conductive layer 15. Accordingly, the second dielectric layer maintains its well-defined thickness and the capacitance between the surface 15 and the ground plane 11 obtains the wanted characteristic. However, a very thin layer of the layer 16 is remained under the deformed part of the layer 17 and it can be used to adhere layer 17 to the ground plane 13. Here, iris supposed that the layer 17 also has partly adhesive characteristics so that the conductor 15 and the substrate 12 can be attached together.

Figure 2:
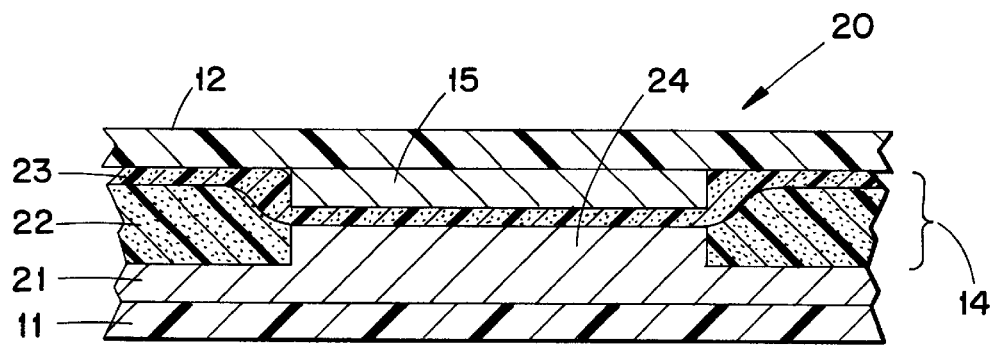
FIG. 2 shows in a schematic way a cross-section through a part of a second PCB with a buried capacitor. according to the invention.

The second embodiment of a PCB 20 is shown in FIG. 2. Here, the same parts are denoted with the same reference signs as in the example according to FIG. 1. In this case, the ground plane 21 is provided with elevations 24, which essentially correspond to the surface IS. The layer 22, which corresponds to the layer 16 in FIG. 1 is slightly thicker, while the layer 23 corresponding to layer 17, has slightly smaller thickness. Likewise, the material in the layer 22 has been pressed away so that the space between the layer 23 and the ground plane and other unevenness surfaces, which can occur between layers have been filled.

The entire dielectric layer 14 in a first step can be produced as a homogenous film, which either contains very little or no material at all with high dielectric constant $D_k$, whereby the plastic characteristics of the film are not changed. This can be the case when lower capacitance (for example up to about 500 pF) or very thin layer, for example down to $\mu$m are desired.

Figure 3:
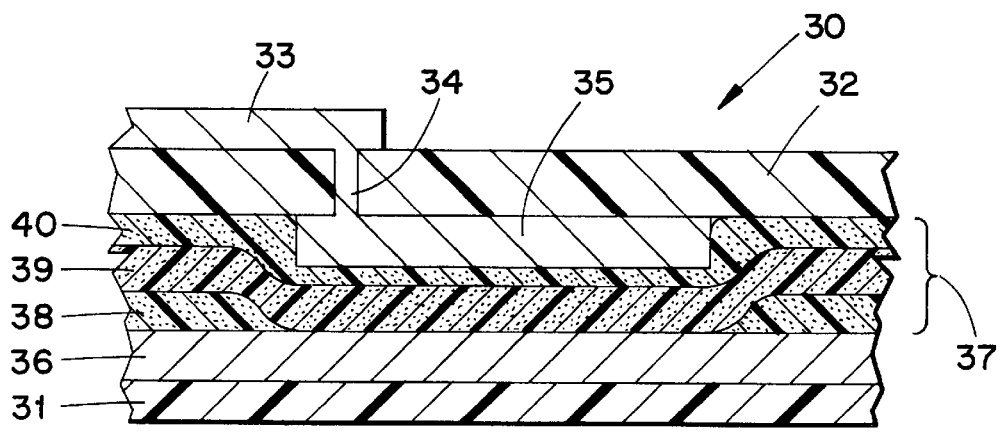
FIG. 3 shows in a schematic way a cross-section tough a part of a third buried capacitor, according to the invention.

FIG. 3 shows a cut through a third PCB 30 made according to the invention. The PCB 30 consists of a lower and an upper insulating substrate 31 and 32. The upper substrate 31 is preferably provided with a number of via holes, through which connections 33 arranged on the PCB are connected by means of conductor 34 to capacitor surface 35. The dielectric layer 37 consists of three separate layers 38, 39 and 40, where the middle layer 39 has higher melting temperature than the two other layers 38 and 40. The layers 38 and 40 can be made of the same or different material, as long as they have lower melting temperature than layer 39.

The conductive layer 35 is pressed in the dielectric layer 37, the different layers of which have been changed in different ways. The layers 38 and 40, which have lower melting temperatures have been pressed away and in the sections beneath the conductor the layers 38, 40 have much smaller than at the sides of the conductor. However, the layer 39 with higher melting temperature has only been pressed against the ground plane without appreciable change thickness and holds a controlled minimum thickness. The controlled thickness depends on the pressure temperature and the pressure, i.e. the temperature and the pressure, for example when applying the capacitor surface 35.

The layers 38 and 40 are primarily used to fill the empty spaces that can appear between the layers because of the unevenmess and to attache the different pans, i.e, the capacitor surfaces 36, 35 and the substrates 32 or 31 to the layer 39. However, other adhesive agents can be used.

By producing the dielectric layer of at least three layers preferably with the outer layers of a thermoplastic material with lower melting temperature, these can be guaranteed to "flow", while the layer with higher melting temperature holds a controlled thickness. As the layers flow, they fill out possible irregularities that can occur between the layers.

Preferably, the different layer of a thermoplastic material in the dielectric material can consist of PTFE (polytetraflourethylene), PFA (perflouroalkoxy) and/or FEP (fluorinated ethylenepropylene), of which PTFE has the highest melting temperature (about 327° C.). Clearly, other suitable material can be used.

The thickness of the different layers 38–40 can be application dependent, in an embodiment the thickness of each layer range between 5 to 75 $\mu$m.

Obviously, the elasticity of the intermediate layers do not need to dependent only on the melting temperature but can be influenced by different pressure, or combinations of pressure and temperature.

The technique according to the invention may also be used for production of other buried components, for example resistors, where the intermediate layers can be replaced with conductive or semi-conductive plastics with different melting temperatures and conductivity.

While we have illustrated and described preferred embodiments of the invention, it is appreciated that several variations and modifications within the scope of the attached the claims can occur.

What we claim is:

1. An electric component buried in a printed circuit board (PCB), said electric component comprising:
    at least two conductive layers; and
    an intermediate layer disposed, in part, between said at least two conductive layers, said intermediate layer including
        a first dielectric layer, wherein the first dielectric layer includes a portion which has a thickness that is reduced over the length of the intermediate layer that is disposed between said at least two conductive layers, and
        a second dielectric layer.

2. The electric component of claim 1, wherein said first layer has a lower melting temperature than said second layer.

3. The electric component of claim 2, wherein the second layer is adhesive.

4. The electric component of claim 2, wherein the intermediate layer further comprises a third layer.

5. The electric component of claim 4, wherein said second layer is disposed between said first and third layers and said second layer has a higher melting temperature than said first and third layers.

6. The electric component of claim 5, wherein the first and third layers consist of a same material.

7. The electric component of claim 5, wherein said first and third layers are used to fill empty spaces and unevenness parts and also to adhere the at least two conductive layers to the second dielectric layer.

8. The electric component of claim 2, wherein the first dielectric layer has a different elastic characteristic than the second dielectric layer at a certain pressure.

9. The electric component of claim 1, wherein the first dielectric layer has a different elastic characteristic than the second dielectric layer at a certain temperature.

10. The electric component of claim 1, wherein the portion of the first dielectric layer which has a thickness that is reduced attaches the second layer to at least one of the conductive layers.

11. The electric component of claim 1, wherein one of the conductive layers is provided with elevations.

12. The electric component of claim 1, wherein said intermediate layer is a homogenous film.

13. The electric component of claim 1, wherein the first and second dielectric layers of the intermediate layer are a material selected from the group consisting of PTFB (polytetraflourethylene), PFA (perflouroalkoxy) and PEP (flourinated ethylenepropylene).

14. The electric component of claim 1, wherein the electric component is a buried capacitor in a multilayer PCB.

15. The electric component of claim 1, wherein the electric component is a buried resistor in a multilayer PCB.

16. A multilayer printed circuit board (PCB) comprising:

a first and a second laminate;

at least two conductive layers; and an intermediate layer disposed, in part, between said at least two conductive layers, said intermediate layer including a first dielectric layer, wherein the first dielectric layer includes a portion which has a thickness that is reduced over the length of the intermediate layer that is disposed between said at least two conductive layers, and a second dielectric layer.

17. The electric component of claim 16, wherein the electric component is a buried resistor in a multilayer PCB.

* * * * *